(12) United States Patent
Höhne et al.

(10) Patent No.: US 10,270,417 B2
(45) Date of Patent: Apr. 23, 2019

(54) MAINS FILTER FOR CONVERTER

(71) Applicant: SIEMENS AKTIENGESELLSCHAFT, München (DE)

(72) Inventors: Silvio Höhne, München (DE); Bernd Kürten, Obermichelbach (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 15/561,890

(22) PCT Filed: Jan. 5, 2016

(86) PCT No.: PCT/EP2016/050057
§ 371 (c)(1),
(2) Date: Sep. 26, 2017

(87) PCT Pub. No.: WO2016/155892
PCT Pub. Date: Oct. 6, 2016

(65) Prior Publication Data
US 2018/0115296 A1    Apr. 26, 2018

(30) Foreign Application Priority Data
Mar. 27, 2015  (EP) .................. 15161447

(51) Int. Cl.
*H03H 7/09*    (2006.01)
*H02M 1/12*    (2006.01)
(Continued)

(52) U.S. Cl.
CPC .............. *H03H 7/09* (2013.01); *H01F 27/24* (2013.01); *H01F 27/28* (2013.01); *H02M 1/126* (2013.01); *H03H 7/075* (2013.01)

(58) Field of Classification Search
CPC .......... H03H 7/09; H03H 7/075; H01F 27/24; H01F 27/28
(Continued)

(56) References Cited

U.S. PATENT DOCUMENTS

| 1,852,125 A | 4/1932 | Miessner |
| 1,920,948 A | 8/1933 | Crouse |

(Continued)

FOREIGN PATENT DOCUMENTS

| JP | H02-206360 | 8/1990 |
| JP | 2007508000 A | 3/2007 |
| WO | WO 2012/143384 | 10/2012 |

OTHER PUBLICATIONS

International Search Report issued by the European Patent Office in International Application PCT/EP2016/050057, dated Apr. 12, 2016.

*Primary Examiner* — Benny T Lee
*Assistant Examiner* — Hafizur Rahman
(74) *Attorney, Agent, or Firm* — Henry M. Feiereisen LLC

(57) ABSTRACT

A converter filter includes an inductor having a main winding and a winding element, and first and second absorption circuits coupled to the inductor. The first and second absorption circuits are decoupled from one another by an inductance of the winding element of the inductor. An auxiliary winding is coupled to the inductor and forms a 1:1 transformer with the winding element. The auxiliary winding is fed via the inductance of the winding element. The auxiliary winding and the second absorption circuit are each connected to an output of the winding element and the first absorption circuit is connected to the auxiliary winding.

6 Claims, 1 Drawing Sheet

(51) Int. Cl.
*H01F 27/24* (2006.01)
*H01F 27/28* (2006.01)
*H03H 7/075* (2006.01)

(58) Field of Classification Search
USPC .......................................................... 333/177
See application file for complete search history.

(56) References Cited

U.S. PATENT DOCUMENTS

| | | |
|---|---|---|
| 6,339,265 B1 | 1/2002 | Levin et al. |
| 7,672,147 B1 | 3/2010 | Schutten et al. |
| 2004/0066253 A1 | 4/2004 | Lauri |
| 2005/0073863 A1 | 4/2005 | Steigerwald |
| 2007/0159860 A1 | 7/2007 | Haeberle et al. |

MAINS FILTER FOR CONVERTER

CROSS-REFERENCES TO RELATED APPLICATIONS

This application is the U.S. National Stage of International Application No. PCT/EP2016/050057, filed Jan. 5, 2016, which designated the United States and has been published as International Publication No. WO 2016/155892 A1 and which claims the priority of European Patent Application, Serial No. 15161447.6, filed Mar. 27, 2015 pursuant to 35 U.S.C. 119(a)-(d).

BACKGROUND OF THE INVENTION

The invention relates to a mains filter for a converter or a filter for a converter in general, i.e. a filter which can be used on the input side or on the output side of the converter.

Converters generate an interference spectrum which is particularly undesirable at the power inlet, predominantly containing harmonics of their switching frequency. To avoid disturbing feedback to the supply mains, the respective resulting interference voltages are dampened by means of a filter or a filter arrangement, and what is more, preferably dampened to such an extent that they no longer create interference—they are therefore filtered out. Such a filter arrangement usually comprises multistage so-called absorption circuits which are arranged between the power inductor of the converter and the power inlet. Inside such a filter arrangement the absorption circuits must be decoupled from one another. To this end, in addition to the power inductor, further inductances are used between the absorption circuits. The full current with which the converter is fed flows through the additional inductances respectively. The additional inductances must therefore have the same current carrying capacity as the power inductor and there is a corresponding requirement for space and corresponding component costs due to the additional inductances.

Previous filter arrangements for a converter are therefore capable of improvement insofar as the additional inductances required for the coupling of the absorption circuits are expensive and require a lot of space on account of the current carrying capacity required, namely the need to be designed for the maximum current of the converter.

SUMMARY OF THE INVENTION

Accordingly, an object of the present invention is to specify a mains filter or a filter arrangement in general for a converter in which the aforementioned disadvantages are avoided or their effects are at least reduced.

According to one aspect of the invention, this object is achieved by a filter arrangement for a converter, hereinafter designated as a converter filter. The converter filter includes a power inductor and at least a first and a second absorption circuit coupled to the power inductor, wherein the inductor includes at least a main winding and a winding element, wherein the first and second absorption circuits are decoupled from one another by means of an inductance of the winding element of the inductor, so that decoupling of the absorption circuits is attainable by means of the winding element of the inductor itself.

In the simplest case, the at least two absorption circuits can be realized in the form of a capacitor, but also in a more complex form and, for example, in the form of an absorption circuit and are attuned to an interference spectrum for filtration. The first and second absorption circuits are, for example, attuned to 8 kHz or 16 kHz. Only the current which is produced by the respective interference spectrum to which the absorption circuit is attuned flows through each absorption circuit. This is lower by an order of magnitude (power of ten) than the current flowing through the inductor, hence an inductor acting as a power inductor of the current supplying the converter.

A small part of an interference which, for example, is discharged by means of an intermediate tap of the absorption circuit connected to the inductor, is coupled to that or any subsequent winding element again. The filter effect is therefore not ideal. Nevertheless, an adequate filter effect is achieved by selecting the ratio of the windings of the winding element to the remaining windings of the inductor appropriately, for example, such that a ratio of 1:10, 1:20 or 1:50 etc. is produced. On account of such a winding ratio, only a fraction of the interference discharged by way of an absorption circuit is coupled again, with a winding ratio of 1:10, for example, only a coupling of approximately 10% of the discharged interference is produced. This has proved to be acceptable and even lower coupling is produced for other winding ratios.

The advantage of the invention is that only the inductor/power inductor need be designed for the maximum current of the converter and this is designed for this maximum current anyway. This and the concomitant potential for savings more than offsets the coupling also capable of being influenced by the winding ratio of an interference discharged by means of an absorption circuit. Instead of additional inductances, decoupling of the absorption circuits is achieved by means of a winding element of the inductor itself, for example, by an intermediate tap on the inductor. Such a tap results in an electrically effective winding element for decoupling of the absorption circuits, wherein the inductance of the winding element produces decoupling. Additional inductance with full current carrying capacity in the form of an independent component is therefore not required.

Advantageous embodiments of the invention are the subject of subclaims. References used point to the further embodiment of the subject of the main claim through the features of the respective subclaim. They are not to be understood as a renunciation of the achievement of an independent, objective protection for the feature combinations of the referenced subclaims. Furthermore, with regard to an interpretation of claims for a more detailed ascertainment of a feature in a subordinate claim, it must be assumed that such a restriction does not exist in the respective preceding claims.

In a particular embodiment of the converter filter, an auxiliary winding is coupled to the inductor. A few windings are sufficient for the auxiliary winding, for example, a winding or even half a winding and up to approx. 10% of the windings of the inductor. The auxiliary winding forms a 1:1 transformer with the corresponding respective number of windings of the inductor. The windings of the inductor belonging to the transformer correspond to the aforementioned winding element of the inductor. A special tap for contacting the winding element is no longer necessary due to the auxiliary winding and its (magnetic) coupling to the winding element. The absorption circuits are decoupled from one another by means of the self-inductance of the auxiliary winding and the mutual inductance between auxiliary and main winding. The reason for the mutual inductance is the magnetic coupling of the auxiliary winding to the main winding and winding element. It is therefore also justified to speak of a decoupling of the absorption circuits by means of the inductance of a winding element of the inductor in the case of a converter filter with an auxiliary winding coupled to the inductor.

This embodiment of the converter filter takes advantage of the aforementioned circumstance that only the current which is produced by the respective interference spectrum to which the absorption circuit is attuned flows through the individual absorption circuits. This is lower by at least an order of magnitude (power of ten) than the current flowing through the inductor, therefore in an inductor acting as a power inductor of the current supplying the converter. The auxiliary winding can therefore be significantly smaller in size with regard to its current carrying capacity. As a result, a combination of the auxiliary winding with the inductor is easily possible.

In a special embodiment of a converter filter with an auxiliary winding, the auxiliary winding and the combination of the auxiliary winding with the inductor are the result of rewinding a conductor from the output of the inductor. Accordingly, the inductor and the auxiliary winding together form a three-pin electrical component which electrically corresponds to an inductor with an intermediate tap.

If the auxiliary winding is combined with the inductor such that the auxiliary winding is positioned in a winding space of the inductor customarily to be kept free for compliance with clearance and creepage distances between the winding and the inductor core, due to the auxiliary winding there is no requirement for additional space. A circuit or an electrical device with such a converter filter can therefore be correspondingly small in size.

With such positioning of the auxiliary winding in the winding space of the inductor, the use of an insulation system composed of various materials is considered for the conductor forming the auxiliary winding in order to ensure respectively envisaged disruptive strength, heat resistance and/or durability.

An exemplary embodiment of the invention is explained in more detail hereinafter with reference to the diagram. Objects or elements corresponding to one another are given the same reference characters in all the figures, in which:

DETAILED DESCRIPTION OF PREFERRED EMBODIMENTS

Figure 1:
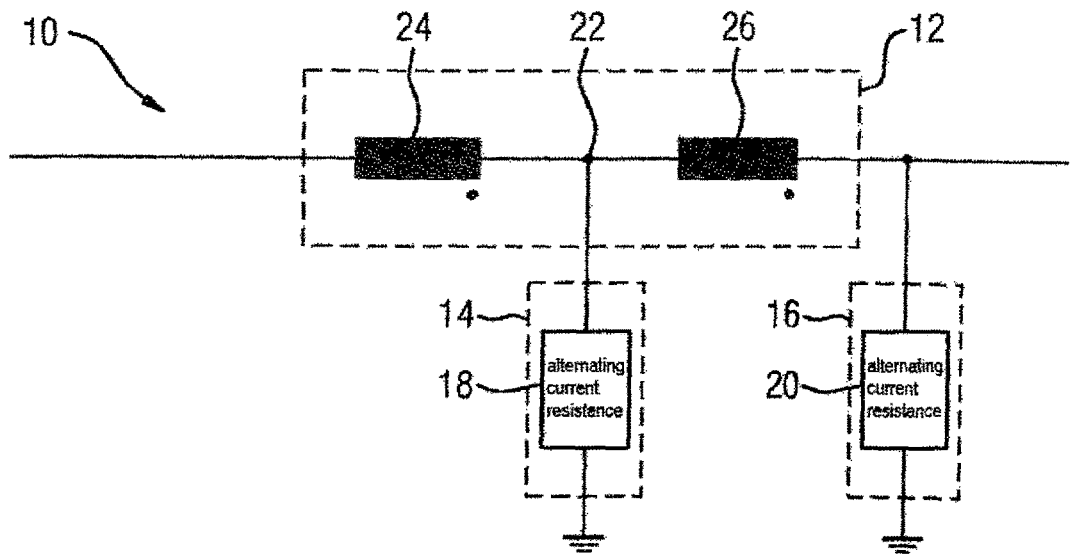
FIG. 1 shows a first embodiment of the filter arrangement proposed here.

The representation in FIG. 1 shows a first embodiment of the filter arrangement proposed here. This is described here and hereinafter as a converter filter 10. The converter filter 10 includes one inductor 12 and at least two absorption circuits 14, 16 hereinafter described as a first absorption circuit 14 and as a second absorption circuit 16 by way of distinction. When the converter filter 10 is used as a mains filter, the inductor 12 operates as a power inductor 12. The converter filter 10 is also considered for use as a load-side filter and then operates, for example, as a motor filter.

In the simplest case, both the absorption circuits 14, 16 shown comprise a capacitor but can also be more complex in structure and for example, realized in the form of an absorption circuit. This is shown in the form of an alternating current resistance 18, 20 respectively.

As is well known, an absorption circuit 14, 16 is an ordinarily grounded two-pin with the lowest possible ohmic resistance and a particularly low total resistance in the range of a resonance frequency. The respective resonance frequency of the absorption circuit 14, 16 is the result of corresponding sizing of the capacitor or further components. By means of such sizing, the absorption circuit 14, 16 can be attuned to a frequency for cancellation in the circuit to which it is connected, in this case the circuit with the converter. The connection of the absorption circuit 14, 16 to ground results in a selective ground fault for the respective resonance frequency. The (interfering) resonance frequency is cancelled in the circuit to which the absorption circuit 14, 16 is connected, in other words, removed from the circuit to some extent due to the discharge to ground.

There is an intermediate tap 22 on the inductor 12 to connect the first absorption circuit 14. In more than two absorption circuits 14, 16, additional intermediate taps of the inductor 12 not shown here are created and used. Due to the at least one intermediate tap 22 on the inductor 12, seen from the location of the tap, this is divided into a main winding 24 and a winding element 26 to some extent. It is important to recall that the main winding 24 and the winding element 26 together form the inductor 12 and that this is not a case of two independent components. The separate representation has only been made here to show the intermediate tap 22.

The winding element 26 separately contactable due to the intermediate taps 22 ensures the necessary decoupling of the absorption circuits 14, 16 from one another, without the need for an additional inductance in the form of a component independent of the inductor 12 and connected in series to the inductor 12 with the same current carrying capacity as the inductor 12.

The intermediate tap 22 or also several intermediate taps 22 solves or solve the problem that for decoupling of a number of absorption circuits 14, 16, hitherto inductances with the inductor 12 connected in series have been required which, like the inductor 12 itself, are each designed for the maximum current of the converter. However, an intermediate tap 22 on the inductor 12 is not easy to realize. An intermediate tap 22 interferes with the homogenous winding structure of the inductor 12 and takes up space.

Figure 2:
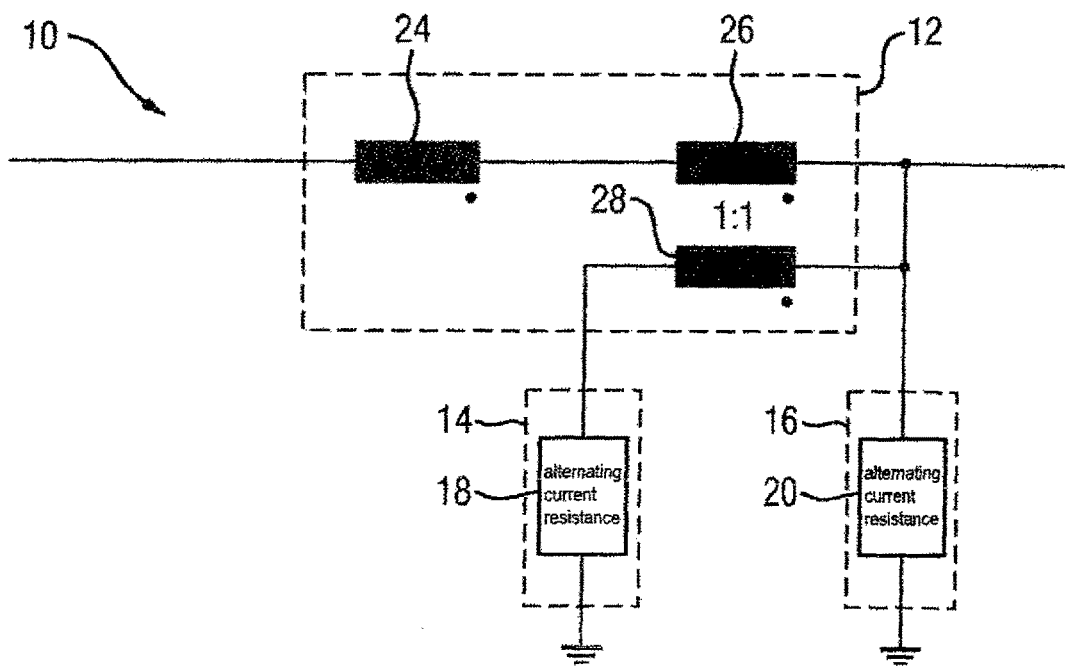
FIG. 2 shows a further embodiment of the filter arrangement proposed here.

In a special embodiment of the converter filter 10 proposed here and without additional inductances with full current carrying capacity, an auxiliary winding 28 is therefore provided. This auxiliary winding is shown together with the inductor 12 and the two exemplary absorption circuits 14, 16 according to FIG. 1 in the representation in FIG. 2.

The auxiliary winding 28 is an electrically equivalent solution to an intermediate tap 22 and a winding element 26 of the inductor 12 which can be contacted with it. The first absorption circuit 14 previously connected (cf. FIG. 1) to the intermediate tap 22 is connected to the auxiliary winding 28. The auxiliary winding 28 effects the decoupling of the two absorption circuits 14, 16.

The auxiliary winding 28 is produced, for example, by the "rewinding" of a conductor from the output of the inductor 12. The auxiliary winding 28 only comprises a few windings. During testing it has been established that a single winding is sufficient. A higher number of windings is nevertheless also possible.

The auxiliary winding 28 is coupled to a number of windings of the inductor 12 (winding element 26) corresponding to the number of windings of the auxiliary winding 28 in the form of a 1:1 transformer. The winding element 26 effective in this respect produces a mutual inductance in the auxiliary winding 28. This justifies the definition of the converter filter 10, whereupon the first and the second absorption circuits 14, 16 are decoupled from one another by means of the self-inductance of a winding element 26 of the inductor 12 and the mutual inductance between the main winding and the winding element. In the special embodiment shown in FIG. 2 this decoupling is specifically achieved with the auxiliary winding 28 coupled to the winding element 26 and its inductive coupling.

Although the invention was illustrated and described in more detail by the exemplary embodiment, the invention is not restricted by the disclosed examples and other variations can be derived from it by a person skilled in the art, without departing from the scope of the invention.

Individual key aspects of the description submitted here can be briefly summarized as follows: Specified is a converter filter 10 with an inductor 12 and at least one first and one second absorption circuit 14, 16 coupled to the inductor 12, wherein the first and the second absorption circuit 14, 16 are decoupled from one another by means of the inductance of a winding element 26 of the inductor 12 or by means of an auxiliary winding 28 coupled to the inductor 12, wherein the auxiliary winding 28 forms a 1:1 transformer with the winding element 26 and the winding element 26 is fed by means of the inductance.

The invention claimed is:

1. A converter filter, comprising:
   an inductor including a main winding and a winding element, both the main winding and the winding element being wound around a core with a first winding direction;
   first and second absorption circuits coupled to the inductor, said first and second absorption circuits being decoupled from one another by an inductance of the winding element of the inductor; and
   an auxiliary winding coupled to the inductor, said auxiliary winding being wound in a second winding direction opposite the first winding direction and forming a 1:1 transformer with the winding element and being fed via the inductance of the winding element, said auxiliary winding and said second absorption circuit being each connected to an output of the winding element, and said first absorption circuit being connected to the auxiliary winding.

2. The converter filter of claim 1, wherein a space is formed between the main winding and the winding element of the inductor and the core to maintain clearance and creepage distances, with the space accommodating the auxiliary winding.

3. A circuit or an electrical device, comprising a converter filter comprising an inductor including a main winding and a winding element, both the main winding and the winding element being wound around a core in a first winding direction, first and second absorption circuits coupled to the inductor, said first and second absorption circuits being decoupled from one another by an inductance of the winding element of the inductor, and an auxiliary winding coupled to the inductor, said auxiliary winding being wound in a second winding direction opposite the first winding direction and forming a 1:1 transformer with the winding element and being fed via the inductance of the winding element, said auxiliary winding and said second absorption circuit being each connected to an output of the winding element, and said first absorption circuit being connected to the auxiliary winding, said converter filter operating as a mains filter at an input of a converter.

4. The circuit or the electric device of claim 3, wherein a space is formed between the main winding and the winding element of the inductor and the core to maintain clearance and creepage distances, with the space accommodating the auxiliary winding.

5. A circuit or an electrical device, comprising a converter filter comprising an inductor including a main winding and a winding element, both the main winding and the winding element being wound around a core in a first winding direction, first and second absorption circuits coupled to the inductor, said first and second absorption circuits being decoupled from one another by an inductance of the winding element of the inductor, and an auxiliary winding coupled to the inductor, said auxiliary winding being wound in a second winding direction opposite the first winding direction and forming a 1:1 transformer with the winding element and being fed via the inductance of the winding element, said auxiliary winding and said second absorption circuit being each connected to an output of the winding element, and said first absorption circuit being connected to the auxiliary winding, said converter filter operating as an output-side filter at an output of a converter.

6. The circuit or the electric device of claim 5, wherein a space is formed between the main winding and the winding element of the inductor and the core to maintain clearance and creepage distances, with the space accommodating the auxiliary winding.

* * * * *